US007309560B2

(12) United States Patent
Sakamoto et al.

(10) Patent No.: US 7,309,560 B2
(45) Date of Patent: Dec. 18, 2007

(54) COMPOSITION FOR FORMING ANTI-REFLECTIVE COATING

(75) Inventors: Rikimaru Sakamoto, Nei-gun (JP); Ken-ichi Mizusawa, Chiyoda-ku (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 358 days.

(21) Appl. No.: 10/504,686

(22) PCT Filed: Feb. 14, 2003

(86) PCT No.: PCT/JP03/01542

§ 371 (c)(1),
(2), (4) Date: Oct. 4, 2004

(87) PCT Pub. No.: WO03/071357

PCT Pub. Date: Aug. 28, 2003

(65) Prior Publication Data

US 2005/0118749 A1    Jun. 2, 2005

(30) Foreign Application Priority Data

Feb. 19, 2002  (JP) .............................. 2002-041482
Jun. 7, 2002   (JP) .............................. 2002-167343

(51) Int. Cl.
*G03C 1/00* (2006.01)
(52) U.S. Cl. .............. 430/270.1; 430/271.1; 430/907; 523/436; 523/523
(58) Field of Classification Search ............ 430/270.1, 430/271.1, 907; 523/436, 523
See application file for complete search history.

(56) References Cited

U.S. PATENT DOCUMENTS

| 5,693,691 A | | 12/1997 | Flaim et al. |
| 5,919,599 A | * | 7/1999 | Meador et al. ........... 430/271.1 |
| 6,416,690 B1 | * | 7/2002 | Soane et al. ................ 264/1.7 |
| 6,495,305 B1 | * | 12/2002 | Enomoto et al. ........ 430/270.1 |
| 2003/0064534 A1 | | 4/2003 | Kawamura et al. |

FOREIGN PATENT DOCUMENTS

| EP | 1 035 442 A2 | | 9/2000 |
| JP | A 10-186671 | | 7/1998 |
| JP | 10-204328 A | * | 8/1998 |
| JP | 10-221855 A | * | 8/1998 |
| JP | A-10-204328 | | 8/1998 |
| JP | A-10-221855 | | 8/1998 |
| JP | 10-239837 A | * | 9/1998 |
| JP | A-10-239837 | | 9/1998 |
| JP | A 11-194499 | | 7/1999 |
| JP | A 11-511194 | | 9/1999 |
| JP | A 2000-187331 | | 7/2000 |
| JP | 2002-198283 | * | 7/2002 |
| JP | A 2002-198283 | | 7/2002 |
| JP | 2002-236370 | * | 8/2002 |
| JP | A 2002-236370 | | 8/2002 |
| JP | A 2002-296789 | | 10/2002 |

OTHER PUBLICATIONS

Lynch et al; "Properties and Performance of Near UV Reflectivity Control Layers", in Advances in Resist Technology and Processing XI, Proceedings of SPIE, 1994, vol. 2195, pp. 225-229.
Taylor et al; "Methacrylate Resists and Antireflective Coatings for 193 nm Lithography", in Advances in Resist Technology and Processing XVI, Proceedings of SPIE, 1999, vol. 3678, pp. 174-185.
Meador et al; "Recent Progress in 193 nm Antireflective Coatings", in Advances in Resist Technology and Proceedings XVI, Proceedings of SPIE, 1999, vol. 3678, pp. 800-809.

* cited by examiner

*Primary Examiner*—Ling-Sui Choi
(74) *Attorney, Agent, or Firm*—Oliff & Berridge, PLC

(57) ABSTRACT

There is provided a composition for forming anti-reflective coating for use in a lithography process with irradiation light from F2 excimer laser (wavelength 157 nm) which has a high effect of inhibiting reflected light and causes no intermixing with resist layers, and an anti-reflective coating prepared from the composition, and a method of controlling attenuation coefficient of the anti-reflective coating.

Concretely, the composition is one containing a polymer compound containing halogen atom for forming anti-reflective coating for use in a lithographic process in manufacture of a semiconductor device. The polymer compound is one which halogen atom is introduced to a main chain thereof and/or a side chain bonded to the main chain. The attenuation coefficient can be controlled by changing the content of halogen atom in the solid content of the composition.

11 Claims, No Drawings

COMPOSITION FOR FORMING ANTI-REFLECTIVE COATING

TECHNICAL FIELD

The present invention relates to a composition for forming anti-reflective coating, particularly to a composition for reducing a reflection of irradiation light for exposing a photoresist applied on a substrate from the substrate in a lithography process for manufacturing a semiconductor device, and more particularly to a composition for forming anti-reflective coating comprising a polymer compound composition effectively absorbing reflection light from the substrate in a lithography process for manufacturing a semiconductor device by use of irradiation light for exposure with a wavelength of 157 nm.

BACKGROUND ART

Conventionally, in the manufacture of semiconductor devices, micro-processing by lithography using a photoresist composition has been carried out. The micro-processing is a processing method including forming a thin film of a photoresist composition on a silicon wafer, irradiating actinic rays such as ultraviolet rays through a mask pattern depicting a pattern for a semiconductor device, developing it to obtain a resist pattern, and etching the silicon wafer using the resist pattern as a protective film. However, in recent progress in high integration of semiconductor devices, there has been a tendency that shorter wavelength actinic rays are being used, i.e., ArF excimer laser beam (wavelength 193 nm) have been taking the place of i-line (wavelength 365 nm) or KrF excimer laser beam (wavelength 248 nm). Along with this change, influences of random reflection and standing wave off a substrate have become serious problems. Accordingly, it has been widely studied to provide an anti-reflective coating between the photoresist and the substrate (Bottom Anti-Reflective Coating, BARC). In addition, it comes to be considered to utilize F2 excimer laser (wavelength 157 nm) being a light source with a shorter wavelength for micro-processing by lithography.

As the anti-reflective coating, inorganic anti-reflective coatings made of titanium, titanium dioxide, titanium nitride, chromium oxide, carbon or α-silicon and organic anti-reflective coatings made of a light-absorbing substance and a polymer compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example U.S. Pat. Nos. 5,919,599 and 5,693,691).

The physical properties desired for organic anti-reflective coating materials include high absorbance to light and radioactive rays, no intermixing with the photoresist layer (being insoluble in photoresist solvents), no diffusion of low molecular substances from the anti-reflective coating material into the topcoat resist upon coating or heat-drying, and a higher dry etching rate than the photoresist (see, for example, Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229; G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185; and Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809).

By the way, a hitherto technique of anti-reflective coatings has been mainly considered on lithography process with irradiation light having a wavelength of 365 nm, 248 nm or 193 nm. As a result of such consideration, light absorbing components and light absorbing groups effectively absorbing light of each wavelength are developed, and they come to be utilized as one component of an organic anti-reflective coating composition. For example, it is known that chalcone dies prepared by condensation of 4-hydroxyacetophenone with 4-methoxybenzaldehyde are effective for irradiation light having a wavelength of 365 nm (see, for example Japanese Patent Laid-open No. Hei 11-511194), it is known that naphthalene group-containing polymers having a specific structure have high absorbance for irradiation light having a wavelength of 248 nm (see, for example Japanese Patent Laid-open No. Hei 10-186671), and it is known that resin binder compositions containing phenyl unit are excellent for irradiation light having a wavelength of 193 nm (see, for example Japanese Patent Laid-open No. 2000-187331).

In recent years, lithography process with F2 excimer laser (wavelength 157 nm) being a light source having a shorter wavelength comes to be regarded as next-generation technology in place of that with ArF excimer laser (wavelength 193 nm). It is considered that the former process permits micro-processing of process dimension not more than 100 nm, and at present its development and research have been actively carried out from the aspects of apparatus and material, etc. However, most of the research on material relate to photoresist, and it is an actual condition that the research on organic anti-reflective coatings is little known. This is because components effectively absorbing light having a wavelength of 157 nm, that is light absorbing components having a strong absorption band at 157 nm are little known.

It is considered that as irradiation light provides process dimension not more than 100 nm. Therefore, it is also considered that a photoresist is used in a form of thin film having a thickness of 100 to 300 nm that is thinner compared with the prior one. Organic anti-reflective coatings used along with such a photoresist in a form of thin film require the followings: they can be used in a form of a thin film; and they have a high selectivity of dry etching for photoresist. And, it is considered that organic anti-reflective coatings are required to have a large attenuation coefficient k so that they could be used in a shape of thin film having a thickness of 30 to 80 nm. In a simulation with PROLITH ver. 5 (manufactured by Litho Tech Japan; expected and ideal values are used as optical constants (refractive index, attenuation coefficient) of the photoresist), an anti-reflective coating having a base substrate made of silicon with a thickness of 30 to 80 nm can have second minimum thickness (about 70 nm), and in this case the coating has an attenuation coefficient k of 0.3 to 0.6 and a reflectance from substrate of 2% or less, thus has a sufficient anti-reflective effect. In addition, a similar simulation in which silicon oxide is used as base substance and a thickness of silicon oxide varies between 100 nm and 200 nm results in that attenuation coefficient k of 0.4 to 0.6 is required in order to exert a sufficient anti-reflective effect with an anti-reflective coating having a thickness of 70 nm. For example, in case where attenuation coefficient k is 0.2, reflectance from substrate varies between 5% and 10%, and in case where attenuation coefficient k is 0.4, reflectance from substrate varies between 0% and 5%. Consequently, it is considered that in order to exert a sufficient anti-reflective effect, a high attenuation coefficient k, for example 0.3 or more is required. However, any material for organic anti-reflective coatings satisfying such an attenuation coefficient k have been little known.

Under such circumstances, it is demanded to develop organic anti-reflective coatings efficiently absorbing reflection light from base substrate and thereby having an excellent anti-reflective effect.

Further, photoresists for lithography process for which irradiation light from F2 excimer laser are used are actively examined at present, and therefore it is considered that many kinds of photoresists will be developed in future. And, it is considered that a method of changing attenuation coefficient so as to suit required characteristics of each photoresist, for example a method of changing attenuation coefficient k comes to be important.

In the meanwhile, it is known that anti-reflective coating compositions containing fluorine-containing polymer is applied to lithography technique with F2 excimer laser as light source (see, for example, Japanese Patent Laid-open Nos. 2002-236370 and 2002-198283).

The present invention relates to a composition for forming anti-reflective coating, which has a strong absorption of light at a short wavelength, particularly light at wavelength of 157 nm. In addition, the present invention provides a composition for forming anti-reflective coating, which can be used in a lithography process for manufacturing a semiconductor device carried out by using irradiation light from F2 excimer laser (wavelength 157 nm). Further, the present invention provides an anti-reflective coating for lithography which effectively absorbs reflection light from a substrate when irradiation light from F2 excimer laser (wavelength 157 nm) is used for micro-processing, and which causes no intermixing with photoresist layer, and a composition for forming the anti-reflective coating. In addition, the present invention provides a method of forming an anti-reflective coating for lithography by using the composition for forming anti-reflective coating, and a method of forming a photoresist pattern. Further, the present invention provides a method of controlling attenuation coefficient k which is one of main characteristics of anti-reflective coating.

DISCLOSURE OF THE INVENTION

The present invention relates to the following aspects:

as a first aspect, a composition for forming anti-reflective coating characterized in that the composition comprises a solid content and a solvent, and a proportion of halogen atom in the solid content is 10 mass % to 60 mass %;

as a second aspect, the composition for forming anti-reflective coating as described in the first aspect, wherein the solid content contains a polymer compound having a repeating structural unit containing a halogen atom;

as a third aspect, the composition for forming anti-reflective coating as described in the first aspect, wherein the solid content contains a polymer compound having a repeating structural unit containing a halogen atom and a crosslink-forming substituent;

as a fourth aspect, the composition for forming anti-reflective coating as described in the first aspect, wherein the solid content contains a polymer compound having a repeating structural unit containing a halogen atom and a repeating structural unit containing a crosslink-forming substituent;

as a fifth aspect, a composition for forming anti-reflective coating characterized in that the composition contains a polymer compound having a repeating structural unit containing a halogen atom, and an attenuation coefficient k of a coating formed from the composition to light at a wavelength of 157 nm is 0.20 to 0.50;

as a sixth aspect, a composition for forming anti-reflective coating characterized in that the composition contains a polymer compound having a repeating structural unit containing a halogen atom and a crosslink-forming substituent, and an attenuation coefficient k of a coating formed from the composition to light at a wavelength of 157 nm is 0.20 to 0.50;

as a seventh aspect, a composition for forming anti-reflective coating characterized in that the composition contains a polymer compound having a repeating structural unit containing a halogen atom and a repeating structural unit containing a crosslink-forming substituent, and an attenuation coefficient k of a coating formed from the composition to light at a wavelength of 157 nm is 0.20 to 0.50;

as an eighth aspect, the composition for forming anti-reflective coating as described in any one of the second to seventh aspects, wherein the polymer compound contains at least one halogen atom selected from chlorine atom, bromine atom and iodine atom;

as a ninth aspect, the composition for forming anti-reflective coating as described in any one of the second to eighth aspects, wherein the polymer compound contains at least 10 mass % of a halogen atom;

as a tenth aspect, the composition for forming anti-reflective coating as described in any one of the second to ninth aspects, wherein the polymer compound has a weight average molecular weight of 700 to 1,000,000;

as an eleventh aspect, the composition for forming anti-reflective coating as described in the third or sixth aspect, wherein the repeating structural unit containing a halogen atom and a crosslink-forming substituent is represented by formula (1)

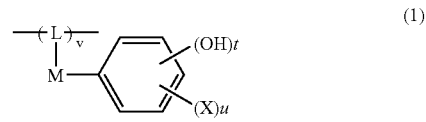

wherein L is a bonding group constituting a main chain of the polymer compound, M is a linking group containing at least one linking group selected from —C(=O)—, —$CH_2$— or —O—, or a direct bond, X is bromine atom or iodine atom, t is a number of 1 or 2, u is a number of 2, 3 or 4, v is a number of the repeating structural units contained in the polymer compound and is a number of 1 to 3,000;

as a twelfth aspect, the composition for forming anti-reflective coating as described in any one of the first to eleventh aspects, wherein the solid content further contains a crosslinking agent having at least two crosslink-forming substituents;

as a thirteenth aspect, a method of forming an anti-reflective coating for use in a manufacture of a semiconductor device, comprising the steps of: coating the composition for forming anti-reflective coating as described in any one of the first to twelfth aspects on a substrate, and baking it;

as a fourteenth aspect, a method of forming an anti-reflective coating for use in a manufacture of a semiconductor device by use of a light of wavelength 157 nm, comprising the steps of: coating the composition for forming anti-reflective coating as described in any one of the first to twelfth aspects on a substrate, and baking it;

as a fifteenth aspect, an anti-reflective coating produced by coating the composition for forming anti-reflective coating as described in any one of the first to twelfth aspects on a semiconductor substrate, and baking it, wherein the anti-reflective coating has an attenuation coefficient k to a light at a wavelength of 157 nm ranging from 0.20 to 0.50;

as a sixteenth aspect, a method of forming an anti-reflective coating for use in a manufacture of a semiconductor device, in which an attenuation coefficient k is altered by changing a content of a halogen atom in the anti-reflective coating;

as a seventeenth aspect, a method of forming an anti-reflective coating for use in a manufacture of a semiconductor device, in which an attenuation coefficient k to a light at a wavelength of 157 nm is altered by changing a content of a halogen atom in the anti-reflective coating;

as an eighteenth aspect, a method of forming a photoresist for use in a manufacture of a semiconductor device comprising the steps of:

coating the composition for forming anti-reflective coating according to any one of the first to twelfth aspects on a semiconductor substrate and baking it to form an anti-reflective coating, forming a photoresist layer on the anti-reflective coating, exposing the semiconductor substrate covered with the anti-reflective coating and the photoresist layer with F2 excimer laser (wavelength 157 nm), and developing the exposed photoresist layer.

BEST MODE FOR CARRYING OUT THE INVENTION

The present invention relates to a composition for forming anti-reflective coating consisting of a solid content containing a halogen atom-containing component and a solvent. In addition, the present invention relates to a composition for forming anti-reflective coating characterized by containing as halogen atom-containing component a polymer compound having a repeating structural unit containing a halogen atom. Further, the present invention relates to a composition for forming anti-reflective coating, which can be used in lithography process for manufacturing a semiconductor device by use of irradiation light of a short wavelength, particularly irradiation light of F2 excimer laser (wavelength 157 nm).

The composition for forming anti-reflective coating according to the present invention basically comprises a polymer compound having a repeating structural unit containing a halogen atom, and a solvent; a polymer compound having a repeating structural unit containing a halogen atom and a crosslink-forming substituent, and a solvent; or a polymer compound having a repeating structural unit containing a halogen atom and a repeating structural unit containing a crosslink-forming substituent, and a solvent, and as arbitrary component a catalyst for crosslinking, a surfactant and the like. The composition for forming anti-reflective coating according to the present invention contains 0.1 to 50 mass %, preferably 0.5 to 30 mass % of solid content. In this specification, the solid content means components other than the solvent in the composition for forming anti-reflective coating.

The molecular weight of the polymer compound containing a halogen atom ranges from 700 to 1,000,000, preferably from 700 to 500,000, and more preferably 900 to 300,000 in terms of weight average molecular weight although it may vary depending on the coating solvents used, the viscosity of the solution, the shape of the coating, etc.

The polymer compound in the present invention is a compound containing at least one kind of halogen atom selected from chlorine atom, bromine atom and iodine atom in the main chain and/or side chain constituting it. The halogen atom to be contained may be one kind, two kinds or three kinds, and preferably is bromine atom or iodine atom. The polymer compound contains preferably at least 10 mass %, more preferably 10 to 80 mass %, further preferably 20 to 70 mass % of halogen atom. The content of the polymer compound in the composition for forming anti-reflective coating according to the present invention is 20 mass % or more in the solid content, for example 20 mass % to 100 mass %, or 30 mass % to 100 mass %, or 50 mass % to 90 mass %, or 60 mass % to 80 mass %.

The polymer compound may contain a crosslink-forming substituent. The crosslink-forming substituent includes amino group, hydroxy group, carboxy group, thiol group, and the like, and these substituents are introduced in the main chain and/or side chain of the polymer compound. The crosslink-forming substituents to be introduced are the same or different. In case where the crosslinking agent component is contained in the composition for forming anti-reflective coating according to the present invention, the crosslink-forming substituents can take place a crosslink-forming reaction with the crosslinking agent component on baking under heating. The crosslink formation exerts an effect of preventing any intermixing between an anti-reflective coating formed by baking and a photoresist applied thereon.

The polymer compound containing halogen atom can be synthesized by a polymerization reaction of unit monomer containing halogen atom, or a polymerization reaction of unit monomer containing halogen atom with unit monomer containing no halogen atom, or by a reaction of a polymer obtained by a polymerization reaction of unit monomer containing no halogen atom with a compound containing halogen atom. Further, the polymer compound can be synthesized by reacting a polymer obtained by a polymerization reaction of unit monomer containing halogen atom or a polymerization reaction of unit monomer containing halogen atom with unit monomer containing no halogen atom, with a compound containing halogen atom or a compound containing no halogen atom. The content (mass %) of halogen atom in the polymer compound can be controlled by reacting the polymer obtained by the polymerization reaction with a compound containing halogen atom or a compound containing no halogen atom.

The unit monomers used for the polymerization reaction may be the same each other, and two kinds or more of the unit monomers may be used. The polymer compound formed from unit monomers can be synthesized by various methods such as radical polymerization, anionic polymerization, cationic polymerization or condensation polymeization. As the type of polymerization, various methods such as solution polymerization, suspension polymerization, emulsion polymerization or bulk polymerization are possible.

The unit monomers include for example compounds having addition polymerizable unsaturated bond, such as acrylic acids, acrylic esters, acrylic amides, methacrylic acids, methacrylic esters, methacrylic amides, vinyl ethers, vinyl alcohols, vinyl ketones, styrenes, vinyl phenols, maleic anhydrides or maleimides, each of which contains halogen atom. In addition, they include condensation polymerizable compounds such as dicarboxylic acid compounds, dihydroxy compounds, diamino compounds, diepoxy compounds, diisocyanate compounds, acid dianhydride compounds, dithiol compounds or phenol compounds, each of which contains halogen atom.

The unit monomer containing no halogen atom include for example compounds having addition polymerizable unsaturated bond, such as acrylic acids, acrylic esters, acrylic amides, methacrylic acids, methacrylic esters, methacrylic amides, vinyl ethers, vinyl alcohols, vinyl ketones, styrenes, vinyl phenols, maleic anhydrides or maleimides, each of which contains no halogen atom. In addition, they include condensation polymerizable compounds such as dicarboxylic acid compounds, dihydroxy compounds, diamino compounds, diepoxy compounds, diisocyanate compounds, acid dianhydride compounds, dithiol compounds or phenol compounds, each of which contains no halogen atom.

As compound containing halogen atom with which a polymer obtained by polymerization reaction of the unit monomer containing no halogen atom is reacted, any compounds which can be reacted with the polymer can be used. For example, in case where there is a hydroxy group in the polymer, the compounds include acid chlorides, epoxy compounds, isocyanate compounds and the like, each of which contains halogen atom. In case where there is an epoxy group in the polymer, the compounds include hydroxy compounds, carboxylic acid compounds, thiol compounds and the like, each of which contains halogen atom. In case where there is an acid anhydride moiety in the polymer, the compounds include hydroxy compounds, amino compounds, thiol compounds and the like, each of which contains halogen atom. In addition, in case where a carboxyl group in the polymer, the compounds include hydroxy compounds, amino compounds, thiol compounds, epoxy compounds and the like, each of which contains halogen atom.

The above-mentioned polymer compounds include for example polyacrylate, polyacrylamide, polymethacrylate, polymethacrylamide, polyvinyl ester, polyvinyl ether, polyvinyl alcohol, polyvinyl ketone, polystyrene, polyvinyl phenol and the like, each of which contains halogen atom and which may be a homopolymer or copolymer. In addition, they include copolymers of acrylates with styrenes, copolymers of acrylates with methacrylates, copolymers of acrylates with vinyl ethers, copolymers of acrylates with vinyl esters, copolymers of methacrylates with styrenes, copolymers of methacrylates with methacrylamides, copolymers of methacrylates with vinyl ethers, copolymers of methacrylates with vinyl alcohols, copolymers of methacrylates with vinyl esters, copolymers of methacrylates with vinyl phenols, copolymers of vinyl ethers with styrenes, copolymers of vinyl alcohols with styrenes, terpolymers of methacrylates, styrenes and vinyl alcohols, terpolymers of acrylates, styrenes and vinyl esters, terpolymers of acrylates, methacrylates and vinyl esters, terpolymers of methacrylates, vinyl esters and vinyl alcohols, each of which contains halogen atom. They include polyurethane, polyester, polyether, polyurea, polyimide, novolak resin and the like, each of which contains halogen atom. Further, they include polymer compounds containing a halogen atom which contain a unit monomer such as maleic anhydride, maleimide or acrylonitrile.

The repeating structural unit containing a halogen atom and a crosslink-forming substituent which is contained in the polymer compound in the composition for forming anti-reflective coating according to the present invention includes structural unit of formula (1)

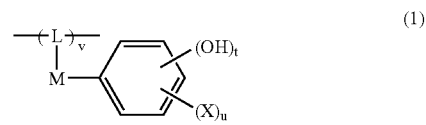

wherein L is a bonding group constituting a main chain of the polymer compound, M is a linking group containing at least one linking group selected from —C(=O)—, —CH2— or —O—, or a direct bond, X is bromine atom or iodine atom, t is a number of 1 or 2, u is a number of 2, 3 or 4, v is a number of the repeating structural units contained in the polymer compound and is a number of 1 to 3,000.

L is not specifically limited so long as it is a bonding group constituting a main chain of the polymer compound, and includes for example the bonding groups of formulae (a-1) to (a-6).

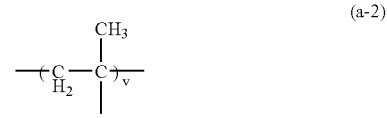

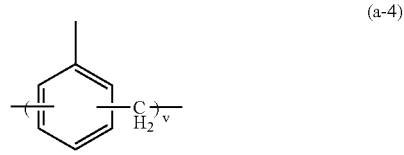

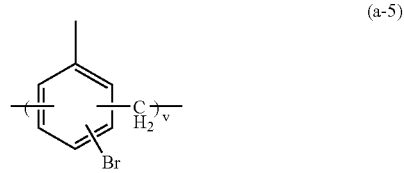

(a-6)
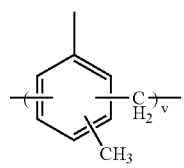

M is a direct bond, or a linking group such as —C(=O)—, —C(=O)O—, —CH$_2$—, —O—, —C(=O)O—CH$_2$—, —C(=O)—NH—, —C(=O)—NH—CH$_2$—, —OC(=O)— or —OC(=O)—CH$_2$—, etc., and further linking groups of formulae (b-1) to (b-8).

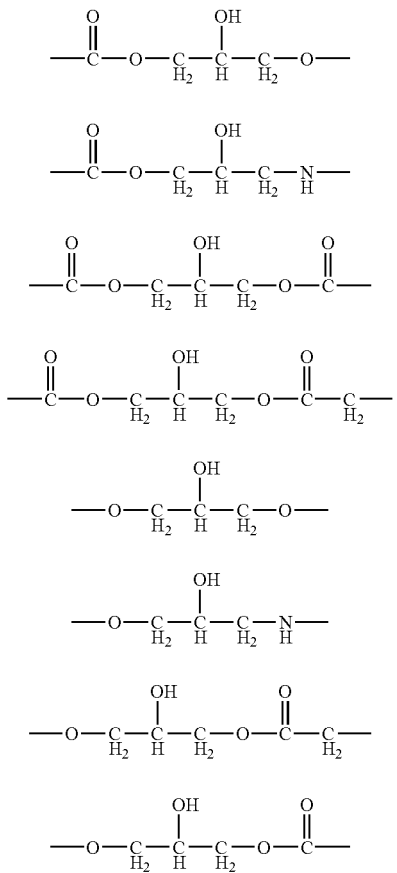

In addition, the benzene ring portion of formula (1) include for example the structures of formulae (c-1) to (c-5).

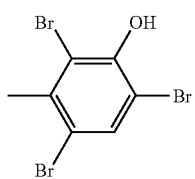
(c-1)

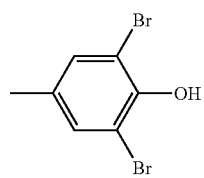
(c-2)

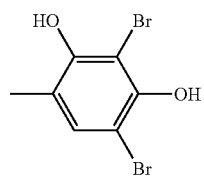
(c-3)

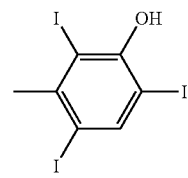
(c-4)

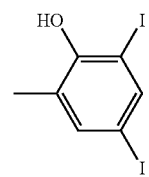
(c-5)

The followings are concrete examples of the repeating structural unit containing a halogen atom which is contained in the polymer compound (formulae [1-1] to [1-34]), the repeating structural unit containing a halogen atom and a crosslink-forming substituent (formulae [2-1] to [2-33]), and the repeating structural unit containing a crosslink-forming substituent ([formulae [3-1] to [3-10]), to which the present invention is not limited.

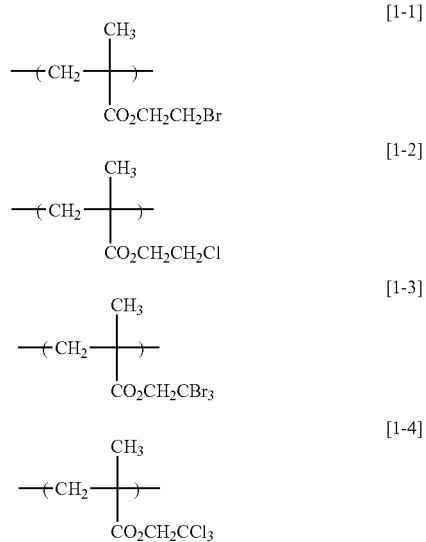

-continued
[1-5] 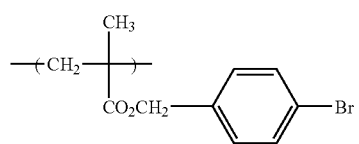
[1-6] 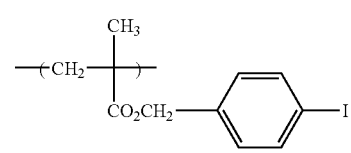
[1-7] 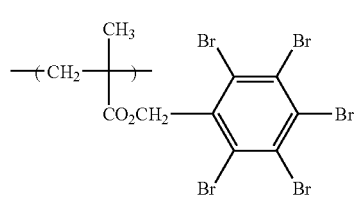
[1-8] 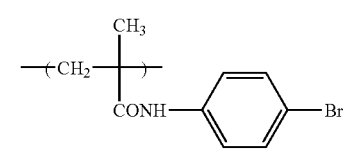
[1-9] 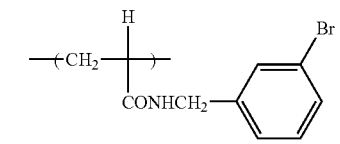
[1-10] 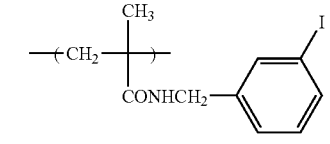
[1-11] 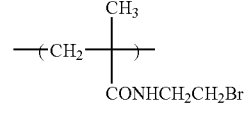
[1-12] 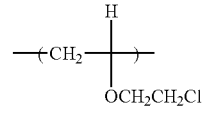
[1-13] 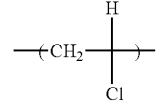
[1-14] 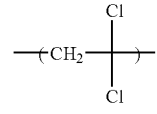
-continued
[1-15] 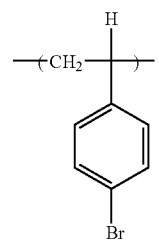
[1-16] 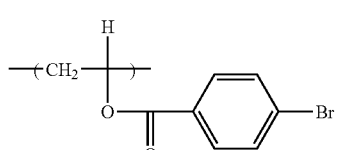
[1-17] 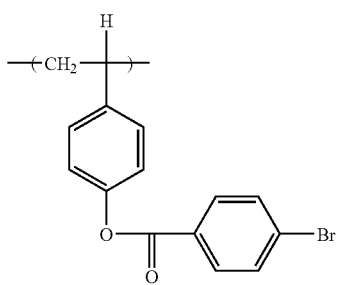
[1-18] 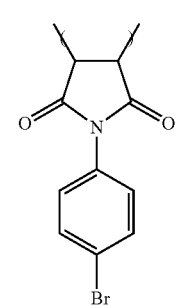
[1-19] 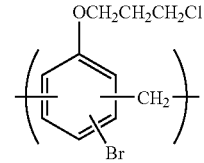
[1-20] 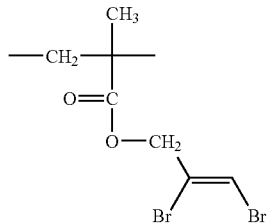
[1-21] 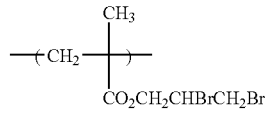

-continued
[1-22] 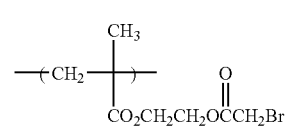
[1-23] 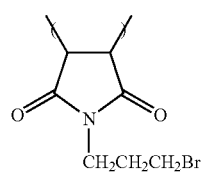
[1-24] 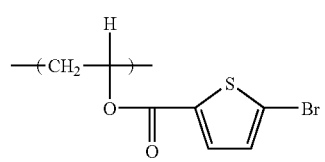
[1-25] 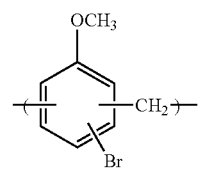
[1-26] 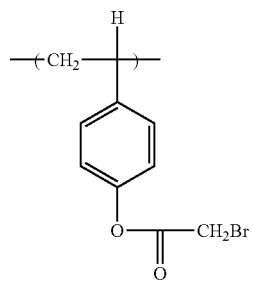
[1-27] 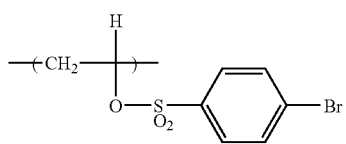
[1-28] 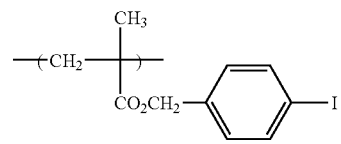
[1-29] 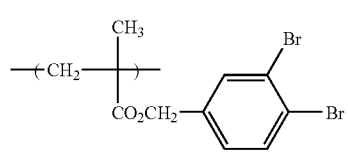
[1-30] 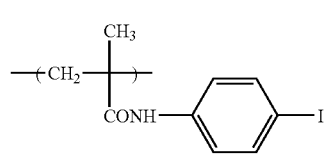
-continued
[1-31] 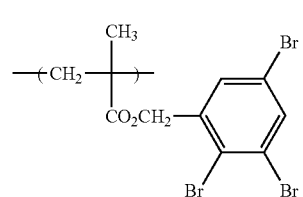
[1-32] 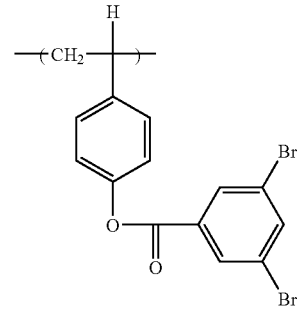
[1-33] 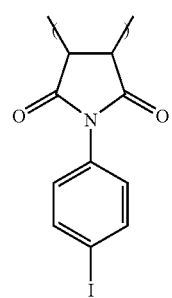
[1-34] 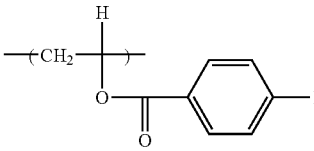
[2-1] 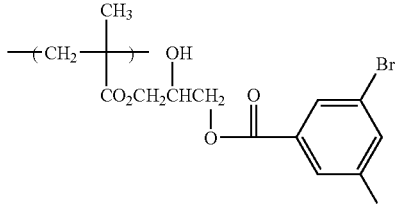
[2-2] 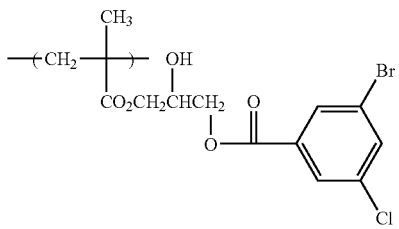

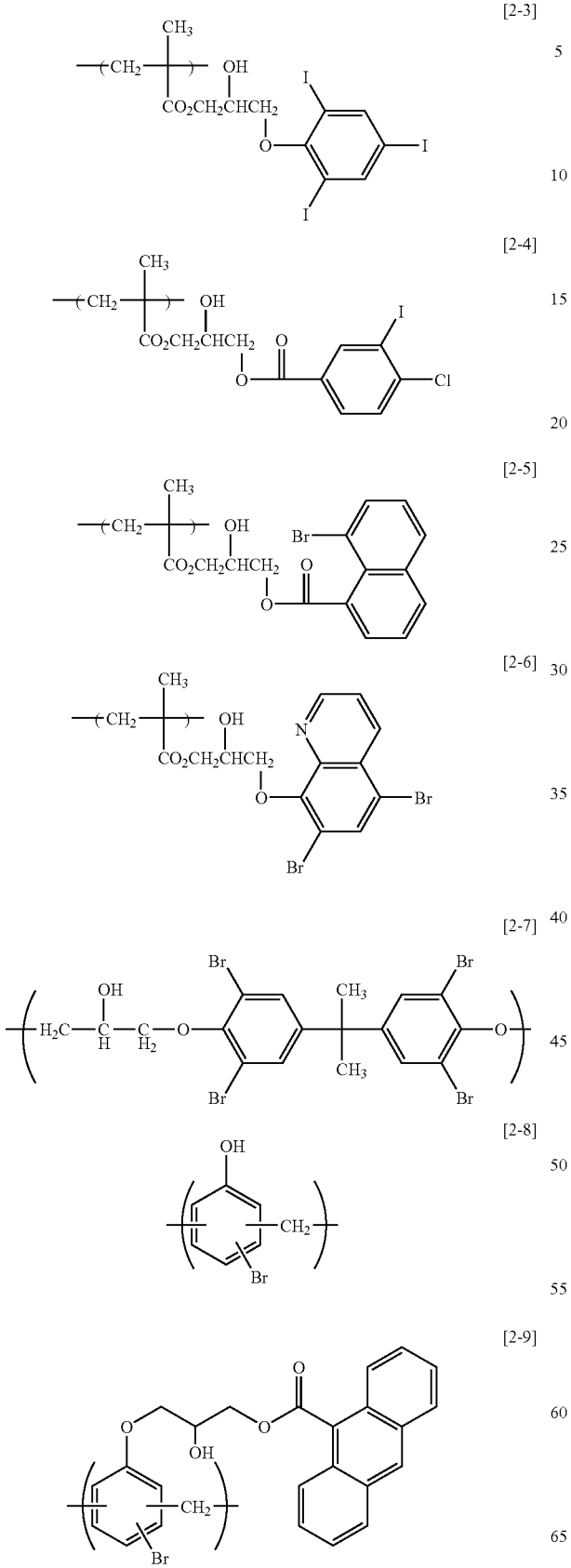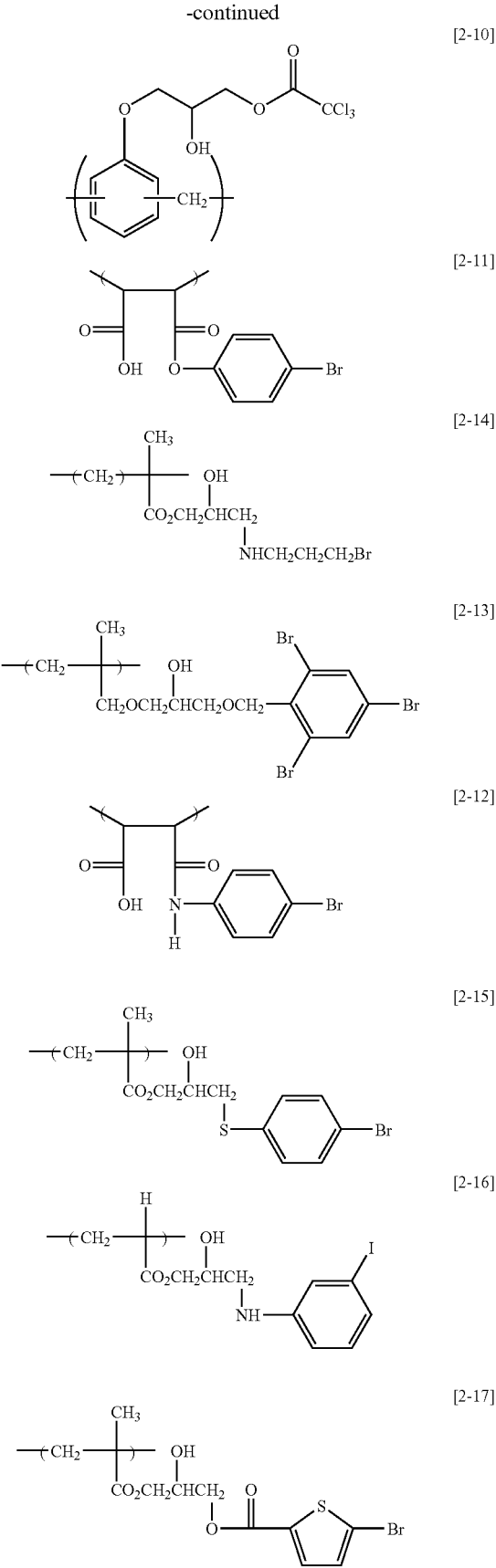

-continued

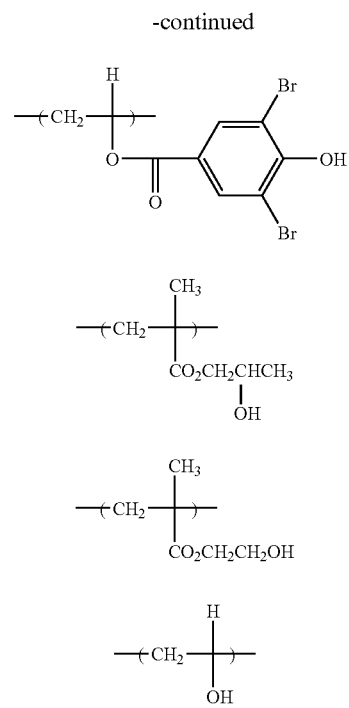
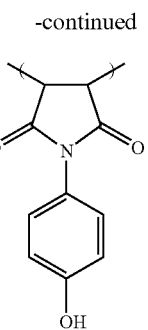
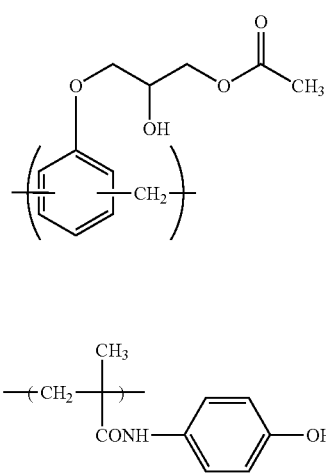
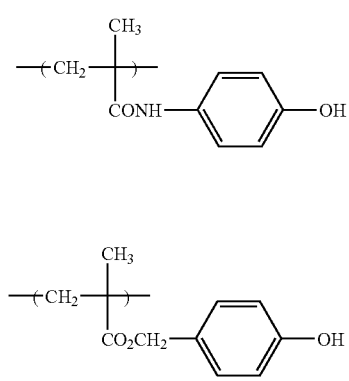
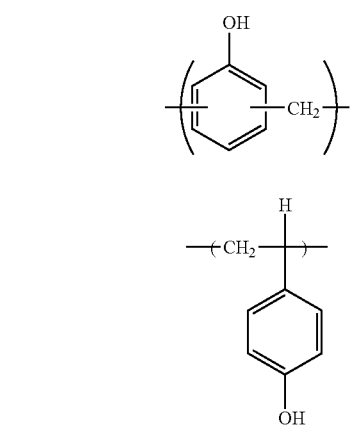
The followings are concrete examples of the polymer compound (formulae [4-1] to [4-47]) in the present invention, to which the present invention is not limited (in the formulae, p, q, r and s are molar ratio of the corresponding constituent unit monomer in the polymer compound, and v is the number of the repeated constituent unit monomers).
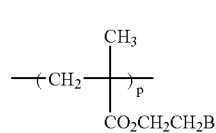 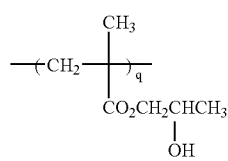  [4-1]
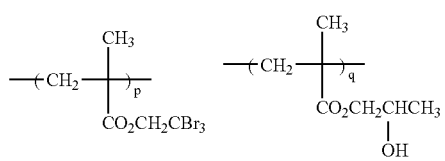  [4-2]

-continued
[4-3]
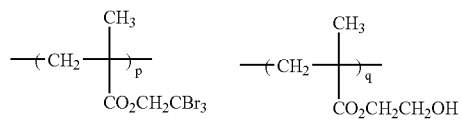
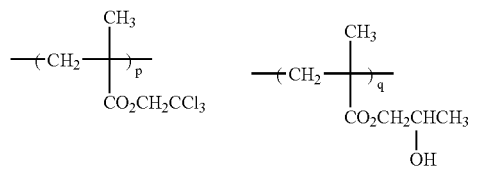
[4-4]
[4-5]
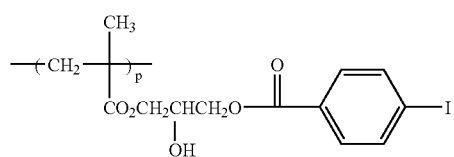
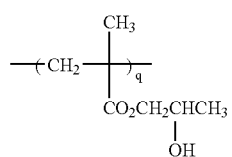
[4-6]
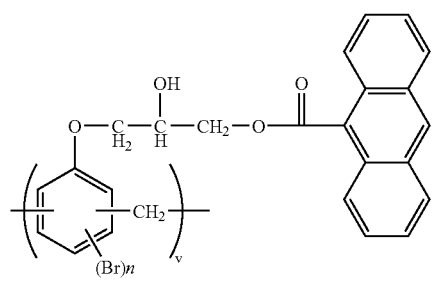
[4-7]
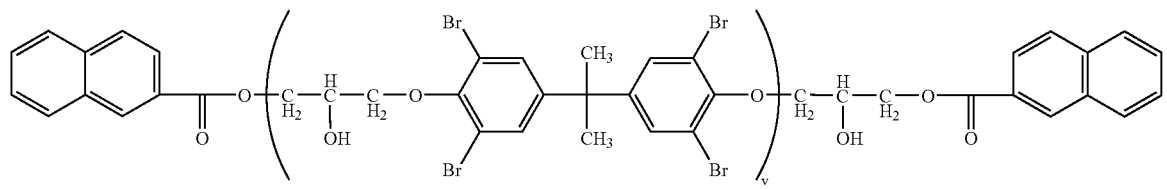
[4-8]
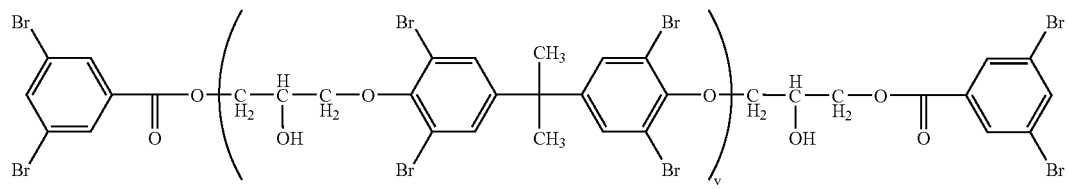
[4-9]
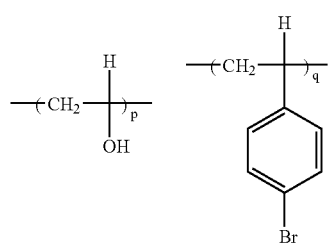
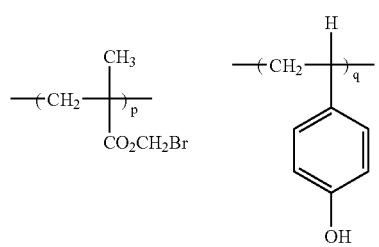
[4-10]
[4-11]
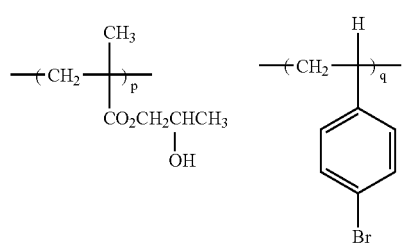

-continued
[4-12]
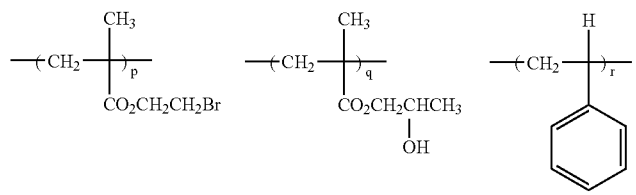
[4-13]
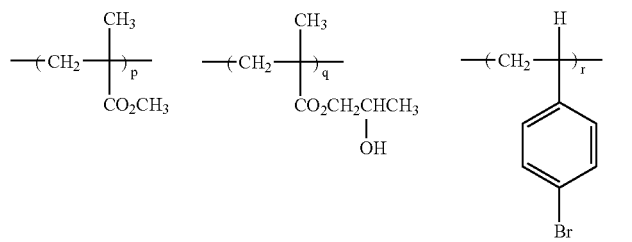
[4-14]
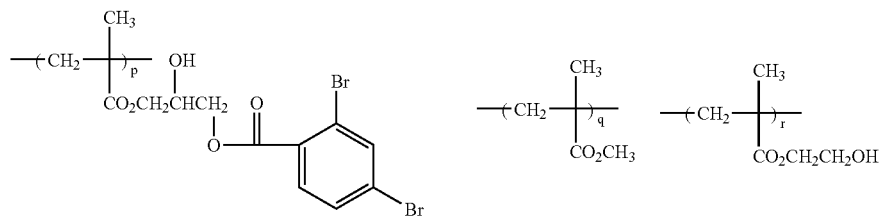
[4-15]
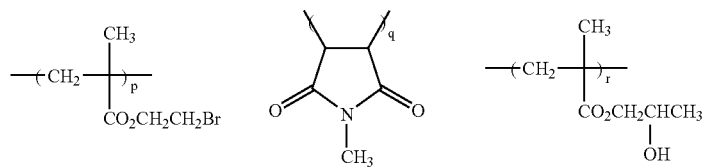
[4-16] [4-17]
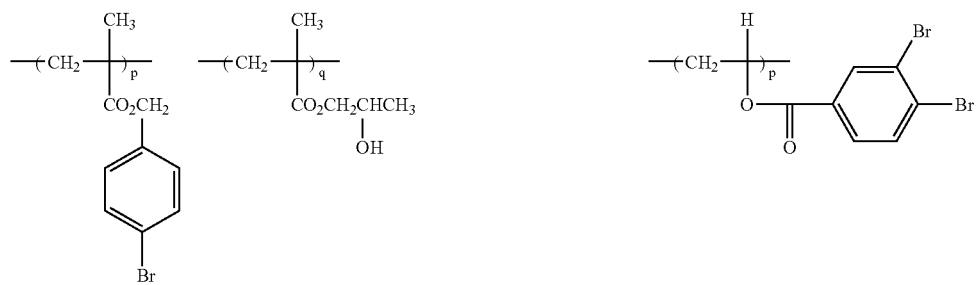
[4-18] [4-19]
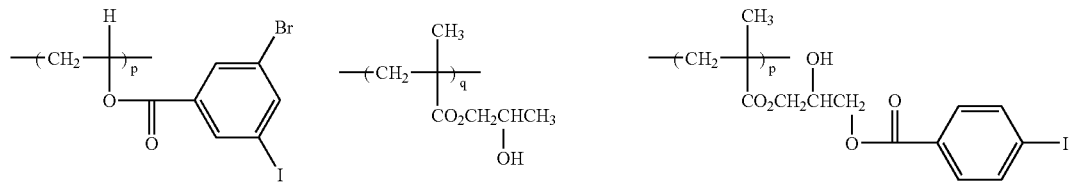
[4-20]
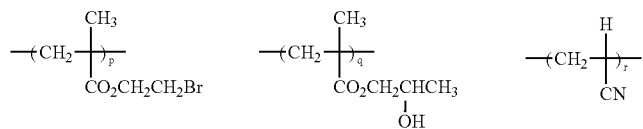

-continued
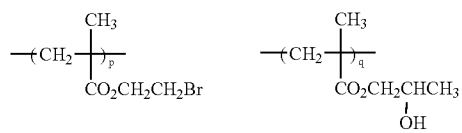 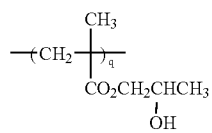 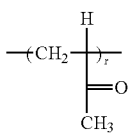
[4-21]
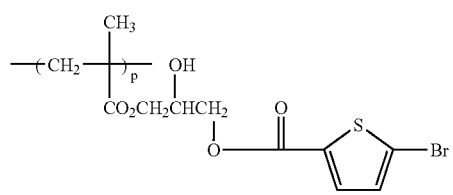 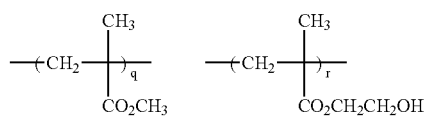
[4-22]
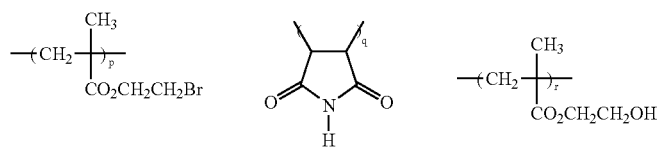
[4-23]
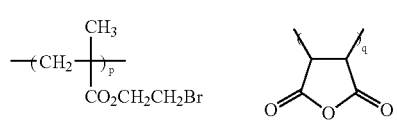 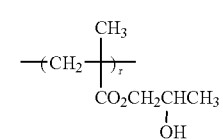
[4-24]
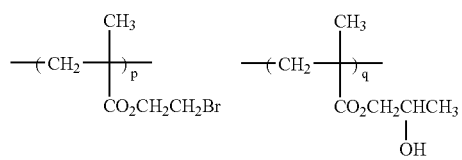 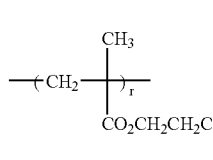
[4-25]
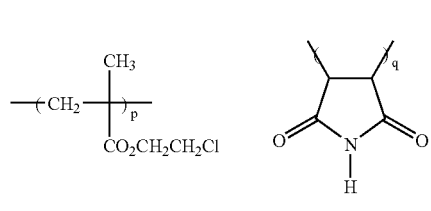 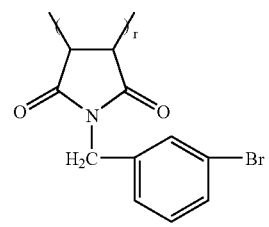
[4-26]
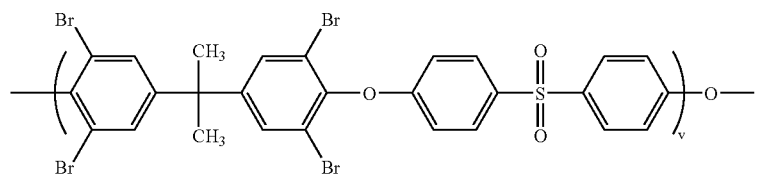
[4-27]
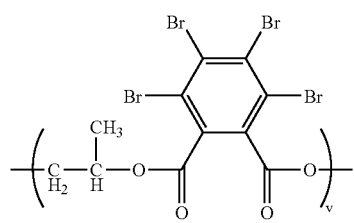 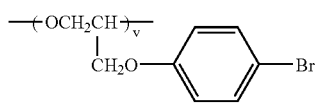
[4-28] [4-29]

-continued
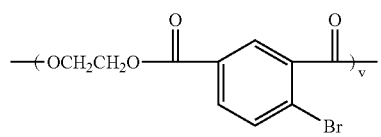
[4-30]
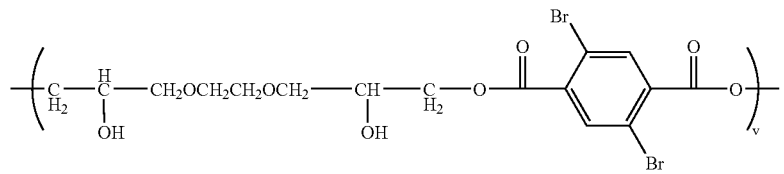
[4-31]
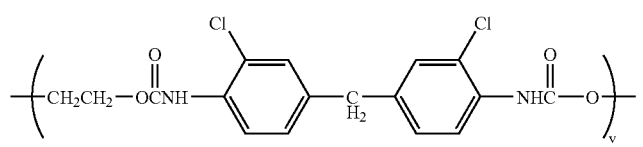
[4-32]
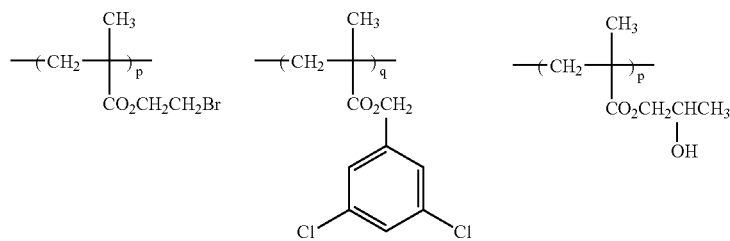
[4-33]
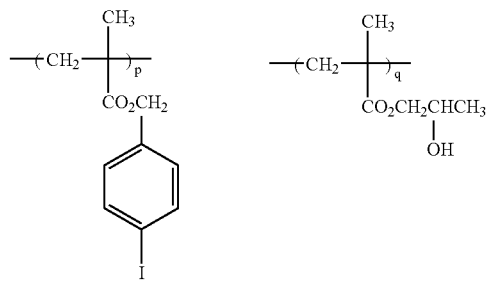
[4-34]
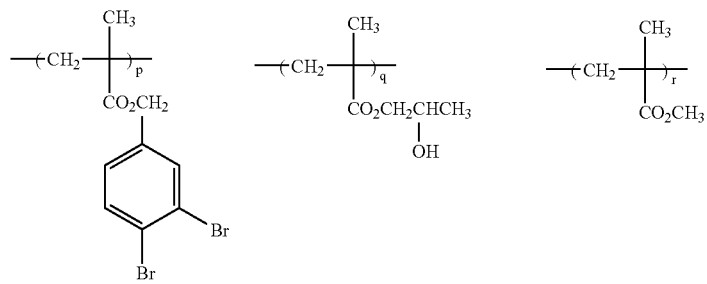
[4-35]
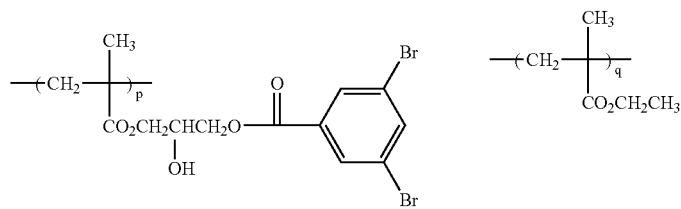
[4-36]

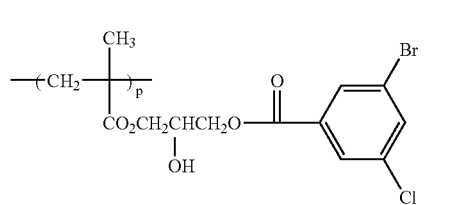
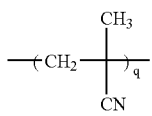
[4-37]
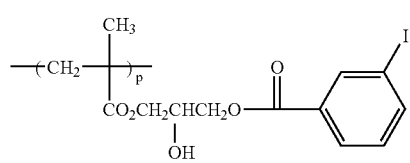
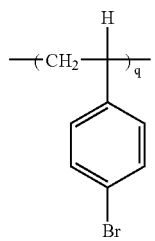
[4-38]
[4-39]
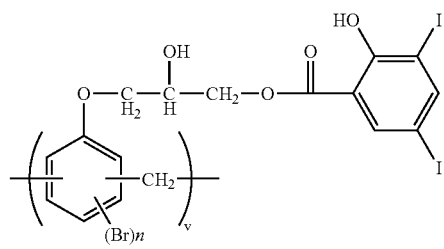
[4-40]
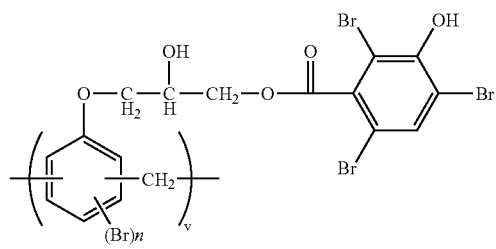
[4-41]
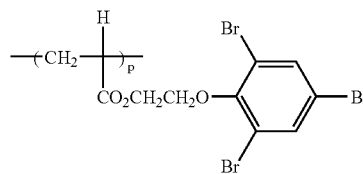
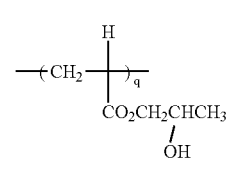
[4-42]
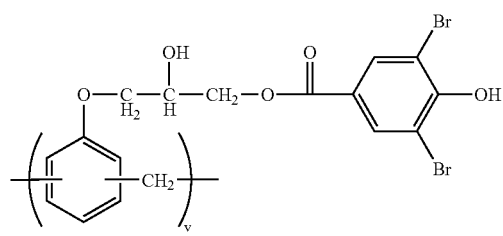
[4-43]
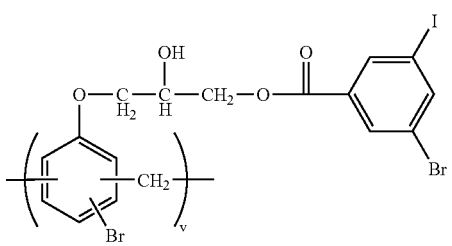
[4-44]
[4-45]
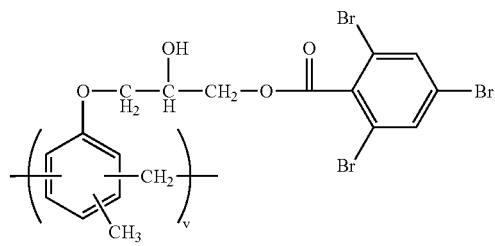
[4-46]
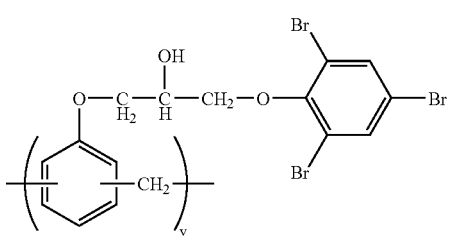

-continued

[4-47]

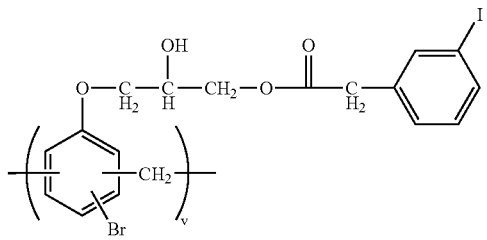

The composition for forming anti-reflective coating according to the present invention can alter the content (mass %) of halogen atom contained in the polymer compound in the composition. That is, the selection of main chain structure of polymer compound, the selection of kind of unit monomer used for the synthesis of polymer compound, the selection of kind of compound with which the polymer obtained by the polymerization reaction is reacted, the selection of number and kind of halogen atom contained in the polymer compound make possible to alter the content (mass %) of halogen atom contained in the polymer compound. The use of polymer compound with different content (mass %) of halogen atom makes possible to alter the content (mass %) of halogen atom in the solid content of the anti-reflective coating, that is, the content (mass %) of halogen atom in the formed anti-reflective coating. And it is possible to control attenuation coefficient k of anti-reflective coating by altering the content (mass %) of halogen atom in the formed anti-reflective coating. In addition, it is also possible to alter the content (mass %) of halogen atom in the formed anti-reflective coating by changing the proportion in the solid content of polymer compound containing halogen atom in a constant content. Therefore, it is also possible to control attenuation coefficient k of anti-reflective coating according to this process. In the meanwhile, in this specification, the solid content means components other than the solvent in composition for forming anti-reflective coating, and the content (mass %) of halogen atom in the formed anti-reflective coating means the content (mass %) of halogen atom in the solid content of the composition for forming anti-reflective coating.

It is required that the solid content in the composition for forming anti-reflective coating according to the present invention contains at least 10 mass % of halogen atom so that the anti-reflective coating formed from the composition for forming anti-reflective coating could sufficiently absorb a light from F2 excimer laser (wavelength 157 nm). The proportion of halogen atom in the solid content of the composition for forming anti-reflective coating according to the present invention is 10 mass % to 60 mass %, or 15 mass % to 55 mass %, or 20 mass % to 50 mass %. The halogen atom in the solid content of the composition for forming anti-reflective coating according to the present invention is chlorine atom, bromine atom or iodine atom, and preferably bromine atom or iodine atom.

The halogen atom in the solid content of the composition for forming anti-reflective coating according to the present invention is contained in the polymer compound as mentioned above. Alternatively, a compound containing halogen atom may be added to the composition for forming anti-reflective coating.

The compound containing halogen atom includes for example a compound having crosslink-forming substituent, such as 4-bromobenzoic acid, 3-iodobenzoic acid, 2,4,6-tribromophenol, 2,4,6-tribromoresorcinol, 2,4,6-triiodophenol, 4-iodo-2-methylphenol, 5-iodo methyl salicylate, 3,4,5-triiodobenzoic acid, 2,4,6-triiodo-3-aminobenzoic acid, 5-amino-2,4,6-triiodoisophthalic acid, 5-hydroxy-2,4,6-triiodoisophthalic acid, 2,4,6-tribromobenzoic acid, 2-amino4,5-dibromo-3,6-dimethylbenzoic acid, 3,5-dibromo-4-hydroxybenzoic acid, 3,5-dibromo-2,4-dihydroxybenzoic acid, 3,5-diiodo-2-hydroxybenzoic acid, 2,4,6-triiodo-3-hydroxybenzoic acid or 2,4,6-tribromo-3-hydroxybenzoic acid.

The anti-reflective coating forming composition according to the present invention is preferably crosslinked after application by heating in order to prevent intermixing with a photoresist applied thereon. In addition, the anti-reflective coating forming composition according to the present invention may further contain a crosslinking agent component. The crosslinking agent includes melamines and substituted ureas having crosslink-forming substituents such as methylol or methoxymethyl groups, or polymer compounds having epoxy groups, and the like. Preferable crosslinking agents are ones having at least two crosslink-forming substituents, for example, compounds such as methoxymethylated glycoluril, methoxymethylated melamine, more preferably tetramethoxymethyl glycoluril or hexamethoxymethyl melamine. Further, the crosslinking agents include compounds such as tetramethoxymethyl urea or tetrabutoxymethyl urea. The addition amount of the crosslinking agent may vary depending on the coating solvents used, the underlying substrate used, the viscosity of the solution required, the shape of the coating required, etc., and usually 0.001 to 20 mass %, preferably 0.01 to 15 mass %, more preferably 0.05 to 10 mass % in the total composition. These crosslinking agents occasionally occur a crosslinking reaction due to self-condensation, but in case where a crosslink-forming substituent is present in the polymer compound in the present invention, the crosslinking agents can react with the crosslink-forming substituent.

As catalyst for promoting the above-mentioned crosslinking reaction in the present invention, acid compounds, such as p-toluenesulfonic acid, trifluoromethanesulfonic acid, pyridinium p-toluenesulfonate, salicylic acid, sulfosalicylic acid, citric acid, benzoic acid, hydroxybenzoic acid, etc. or/and thermal acid generators, such as 2,4,4,6-tetrabromocyclohexadienone, benzointosylate, 2-nitrobenzyltosylate, etc. may be added. The blending amount thereof is 0.02 to 10 mass %, preferably 0.04 to 5 mass % based on 100 mass % of the total solid content.

The anti-reflective coating composition according to the present invention may contain photoacid generators in order to adjust the acidity to that of a photoresist applied thereon in the lithography process. Preferable photoacid generators include for example onium salt photoacid generators, such as bis(4-t-butylpheny)iodonium trifluoromethanesulfonate or triphenylsulfonium trifluoromethanesulfonate, halogen-containing photoacid generators, such as phenyl-bis(trichloromethyl)-s-triazine, sulfonate photoacid generators, such as benzoin tosylate or N-hydroxysuccinimide trifluoromethanesulfonate. The photoacid generators are added in an amount of 0.2 to 3 mass %, preferably 0.4 to 2 mass % based on 100 mass % of the total solid content.

The anti-reflective coating forming composition according to the present invention may contain further light absorbing agents, rheology controlling agents, adhesion auxiliaries, surfactants, etc. in addition to the above described ones, if necessary.

As the further light absorbing agents, the followings can be suitably used: for example commercially available light absorbing agents described in "Technique and Market of Industrial Pigments" (CMC Publishing Co., Ltd.) or "Dye Handbook" (edited by The Society of Synthetic Organic Chemistry, Japan), such as C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; C. I. Pigment Brown 2, and the others. The light absorbing agent is usually blended in an amount of 10 mass % or less, preferably 5 mass % or less based on 100 mass % of the total composition.

The rheology controlling agents are added mainly aiming at increasing the flowability of the anti-reflective coating forming composition and in particular in the baking step, increasing filling property of the anti-reflective coating forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyldecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 mass % based on 100 mass % of the total composition.

The adhesion auxiliaries are added mainly for the purpose of increasing the adhesion between the substrate or photoresist and the anti-reflective coating forming composition, in particular preventing the detachment of the photoresist in development. Specific examples thereof include chlorosilanes such as trimethylchlorosilane, dimethylvinylchlorosilane, methyidiphenylchlorosilane or chloromethyldimethylchlorosilane; alkoxysilanes such as trimethylmethoxysilane, dimethyldiethoxysilane, methyldimethoxysilane, dimethylvinylethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxy-silane or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiliaries are added in proportions of usually less than 5 mass %, preferably less than 2 mass %, based on 100 mass % of the total composition of the anti-reflective coating for lithography.

The anti-reflective coating forming composition according to the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC F171, F173 (Dainippon Ink and Chemicals, Inc.), FLUORAD FC430, FC431 (Sumitomo 3M Limited), ASAHI GUARD AG710, SURFLON S-382, SC101, SC102, SC103, SC104, SC105, SC106 (Asahi Glass Co., Ltd.), organosiloxane polymer KP341 (Shinetsu Chemical Co., Ltd.), etc. The blending amount of the surfactants is usually 0.2 mass % or less, preferably 0.1 mass % or less, based on 100 mass % of the total composition of the anti-reflective coating for lithography according to the present invention. The surfactants may be added singly or two or more of them may be added in combination.

In the present invention, as the solvents for dissolving the above-described solid content such as polymer compounds, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, etc. The organic solvents may be used singly or in combination of two or more of them.

Further, high boiling solvents such as propylene glycol monobutyl ether or propylene glycol monobutyl ether acetate may be mixed. Among the solvents, propylene glycol monomethyl ether, propylene glycol monomethyl ether acetate, ethyl lactate, butyl lactate, and cyclohexanone are preferred for increasing the leveling property.

As photoresist to be coated as an upper layer of the anti-reflective coating in the present invention, any of negative type and positive type photoresists may be used. The photoresist includes a chemically-amplified type resist which consists of a photoacid generator and a binder having a group which is decomposed with an acid and increases alkali dissolution rate, a chemically-amplified type resist consisting of an alkali-soluble binder, a photoacid generator, and a low molecular compound which is decomposed with an acid and increases the alkali dissolution rate of the resist, a chemically-amplified resist consisting of a photoacid generator, a binder having a group which is decomposed with an acid and increases the alkali dissolution rate, and a low molecular compound which is decomposed with an acid and increases the alkali dissolution rate of the resist. The photoresist includes also fluorine atom-containing polymer type photoresist as described in Proc. SPIE, Vol. 3999, 330-334 (2000), Proc. SPIE, Vol. 3999, 357-364 (2000) or Proc. SPIE, Vol. 3999, 365-374 (2000).

As the developer for the above-mentioned positive type photoresist having the anti-reflective coating for lithography formed by using the anti-reflective coating forming composition of the present invention, use may be made of aqueous solutions of alkalis, e.g., inorganic alkalis such as sodium hydroxide, potassium hydroxide, sodium carbonate, sodium silicate, sodium metasilicate or aqueous ammonia, primary amines such as ethylamine or n-propylamine, secondary amines such as diethylamine or di-n-butylamine, tertiary amines such as triethylamine or methyidiethylamine, alcohol amines such as dimethylethanolamine or triethanolamine, quaternary ammonium salts such as tetramethylammonium hydroxide, tetraethylammonium hydroxide or choline, cyclic amines such as pyrrole or piperidine, etc. Furthermore, a suitable amount of alcohols such as isopropyl alcohol or surfactants such as nonionic surfactant can be added to the aqueous solution of above-described alkalis. Among these, a preferred developer includes quaternary ammonium salts, more preferably tetramethylammonium hydroxide and choline.

Now, the method for forming photoresist patterns will be described. On a substrate for use in the production of precision integrated circuit element (silicon/silicon dioxide coat substrate, silicon nitride substrate, glass substrate, ITO substrate or the like), an anti-reflective coating forming composition is coated by a suitable coating method, for example, with a spinner, a coater or the like, and thereafter the substrate is baked to cure the composition to fabricate an anti-reflective coating. The film thickness of the anti-reflective coating is preferably 0.01 to 3.0 μm. The conditions of baking after the coating are 80 to 250° C. for 0.5 to 120 minutes. Then, a photoresist is coated, it is exposed to light through a predetermined mask, developed, rinsed and dried to obtain a good photoresist pattern. If necessary, post exposure bake (PEB) may be performed. In addition, it is able to form a desired pattern on the substrate by removing by dry etching a part of the anti-reflective coating which a photoresist was removed by development in the previous step.

The anti-reflective coating produced from the composition for forming anti-reflective coating according to the present invention in which a polymer compound having repeating structural unit containing halogen atom is contained has a property of absorbing efficiently irradiation light with a wavelength of 157 nm. Therefore, the coating exerts an excellent effect of preventing reflection light from a substrate, and thus a photoresist pattern being an upper layer can be satisfactorily formed. In addition, the anti-reflective coating produced from the composition for forming anti-reflective coating according to the present invention in which a polymer compound having repeating structural unit containing halogen atom has a relatively high dry etching rate owing to inclusion of halogen atom, and can control dry etching rate by changing the content of halogen atom.

The anti-reflective coating formed from the composition for forming anti-reflective coating according to the present invention can be used by selecting process condition as a coating having the following functions: a function of preventing reflection light, a function of preventing a mutual interaction between a substrate and a photoresist, a function of preventing an adverse effect to a substrate by a material used in the photoresist or a substance generated on exposure to the photoresist, or a function of preventing an adverse effect to a photoresist by a substance generated from the substrate on exposure to light or heating.

Hereinafter, the present invention will be described based on examples and comparative examples but the present invention is not limited thereto.

SYNTHESIS EXAMPLE 1

Synthesis of Concrete Example [4-1]

After 13.09 g of 2-bromoethyl methacrylate and 2.44 g of 2-hydroxypropylmethacrylate were dissolved in 54 g of propylene glycol monomethyl ether, the atmosphere was replaced with nitrogen. The resulting solution was warmed to 70° C., and then a solution of 0.47 g of azobisisobutyronitrile dissolved in 10 g of propylene glycol monomethyl ether was added dropwise. The resulting solution was subjected to a reaction under nitrogen atmosphere for 24 hours to obtain a solution of polymer compound of concrete example [4-1]. The resulting polymer compound was subjected to GPC analysis and had a weight average molecular weight (Mw) of 31,000 in terms of standard polystyrene.

SYNTHESIS EXAMPLE 2

Synthesis of Concrete Example [4-2]

After 11.23 g of 2,2,2-tribromoethyl methacrylate and 4.3 g of 2-hydroxypropylmethacrylate were dissolved in 54 g of propylene glycol monomethyl ether, the atmosphere was replaced with nitrogen. The resulting solution was warmed to 70° C., and then a solution of 0.47 g of azobisisobutyronitrile dissolved in 10 g of propylene glycol monomethyl ether was added dropwise. The resulting solution was subjected to a reaction under nitrogen atmosphere for 24 hours to obtain a solution of polymer compound of concrete example [4-2]. The resulting polymer compound was subjected to GPC analysis and had a weight average molecular weight of 22,000 in terms of standard polystyrene.

SYNTHESIS EXAMPLE 3

Synthesis of Concrete Example [4-2]

After 17.72 g of 2,2,2-tribromoethyl methacrylate and 1.7 g of 2-hydroxypropylmethacrylate were dissolved in 70 g of propylene glycol monomethyl ether, the atmosphere was replaced with nitrogen. The resulting solution was warmed to 70° C., and then a solution of 0.58 g of azobisisobutyronitrile dissolved in 10 g of propylene glycol monomethyl ether was added dropwise. The resulting solution was subjected to a reaction under nitrogen atmosphere for 24 hours to obtain a solution of polymer compound of concrete example [4-2]. The resulting polymer compound was subjected to GPC analysis and had a weight average molecular weight of 9,500 in terms of standard polystyrene.

SYNTHESIS EXAMPLE 4

Synthesis of Concrete Example [4-7]

After 10.00 g of brominated bisphenol A epoxy resin (manufactured by Tohto Kasei Co., Ltd.; trade name: YDB-400; weight average molecular weight: 700) was dissolved in 21.33 g of propylene glycol monomethyl ether, 4.12 g of 2-naphthalene carboxylic acid and 0.10 g of benzyl triethylammonium chloride were mixed therewith. The resulting mixture was subjected to a reaction under nitrogen atmosphere at 130+ C. for 24 hours to obtain a solution of polymer compound of concrete example [4-7]. The resulting polymer compound was subjected to GPC analysis and had a weight average molecular weight of 900 in terms of standard polystyrene.

SYNTHESIS EXAMPLE 5

Synthesis of Concrete Example [4-8]

After 20.00 g of brominated bisphenol A epoxy resin (manufactured by Tohto Kasei Co., Ltd.; trade name: YDB-400; weight average molecular weight: 700) was dissolved in 50.25 g of propylene glycol monomethyl ether, 13.50 g of 3,5-dibromobenzoic acid and 0.30 g of benzyl triethylammonium chloride were mixed therewith. The resulting mixture was subjected to a reaction under nitrogen atmosphere at 130° C. for 24 hours to obtain a solution of polymer compound of concrete example [4-8]. The resulting polymer compound was subjected to GPC analysis and had a weight average molecular weight of 1,000 in terms of standard polystyrene.

SYNTHESIS EXAMPLE 6

Synthesis of Concrete Example [4-6]

After 50.00 g of brominated epoxy phenol novolak resin (manufactured by Nippon Kayaku Co., Ltd.; trade name: BREN-304; content of bromine atom: 42 mass %; substituted with c.a. 1.5 bromine atom per benzene ring) was dissolved in 146 g of propylene glycol monomethyl ether, 33.78 g of 9-anthracene carboxylic acid and 1.05 g of benzyl triethylammonium chloride were mixed therewith. The resulting mixture was subjected to a reaction under nitrogen atmosphere at 130° C. for 24 hours to obtain a solution of polymer compound of concrete example [4-6] (wherein n=1.5). The resulting polymer compound was subjected to GPC analysis and had a weight average molecular weight of 1,600 in terms of standard polystyrene.

SYNTHESIS EXAMPLE 7

Synthesis of Concrete Example [4-4]

After 6.74 g of 2,2,2-trichloroethyl methacrylate and 2.79 g of 2-hydroxypropylmethacrylate were dissolved in 80 g of propylene glycol monomethyl ether, the atmosphere was replaced with nitrogen. The resulting solution was warmed to 70° C., and then a solution of 0.48 g of 2,2'-azobis(4-methoxy-2,4-dimethylvaleronitrile) dissolved in 10 g of propylene glycol monomethyl ether was added dropwise. The resulting solution was subjected to a reaction under nitrogen atmosphere for 24 hours to obtain a solution of polymer compound of concrete example [44]. The resulting polymer compound was subjected to GPC analysis and had a weight average molecular weight of 12,000 in terms of standard polystyrene.

SYNTHESIS EXAMPLE 8

Synthesis of Concrete Example [4-5]

After 30 g of 20 mass % solution of copolymer (molar ratio 50:50) of glycidyl methacrylate and 2-hydroxypropyl methacrylate in propylene glycol monomethyl ether was mixed with 4.79 g of 4-iodobenzoic acid, 0.12 g of benzyl triethyl ammonium chloride and 19.64 g of propylene glycol monomethyl ether, the resulting mixture was subjected to a reaction by heating at reflux under nitrogen atmosphere for 24 hours to obtain a solution of polymer compound of concrete example [4-5].

SYNTHESIS EXAMPLE 9

Synthesisis of Concrete Example [4-19]

After 20 g of 20 mass % solution of polyglycidyl methacrylate in propylene glycol monomethyl ether was mixed with 6.21 g of 4-iodobenzoic acid, 0.12 g of benzyl triethyl ammonium chloride and 25.44 g of propylene glycol monomethyl ether, the resulting mixture was subjected to a reaction by heating at reflux under nitrogen atmosphere for 24 hours to obtain a solution of polymer compound of concrete example [4-19].

SYNTHESIS EXAMPLE 10

After 60 g of 2-hydroxypropyl methacrylate was dissolved in 242 g of propylene glycol monomethyl ether, the resulting solution was warmed to 70° C. Thereafter, while the reaction solution was kept at 70° C., 0.6 of azobisisobutyronitrile was added thereto, and then the resulting solution was subjected to a reaction at 70° C. for 24 hours to obtain a solution of poly 2-hydroxypropyl methacrylate. The resulting polymer compound was subjected to GPC analysis and had a weight average molecular weight of 50,000 in terms of standard polystyrene.

SYNTHESIS EXAMPLE 11

Synthesis of Concrete Example [4-39]

After 10.00 g of brominated epoxy phenol novolak resin (manufactured by Nippon Kayaku Co., Ltd.; trade name: BREN-304; content of bromine atom: 42 mass %; substituted with c.a. 1.5 bromine atom per benzene ring) was dissolved in 32.88 g of propylene glycol monomethyl ether, 11.63 g of 3,5-diiodo salicylic acid and 0.29 g of benzyl triethylammonium chloride were mixed therewith. The resulting mixture was subjected to a reaction under nitrogen atmosphere at 130° C. for 24 hours to obtain a solution of polymer compound of concrete example [4-39] (wherein n=1.5). The resulting polymer compound was subjected to GPC analysis and had a weight average molecular weight of 2,000 in terms of standard polystyrene.

SYNTHESIS EXAMPLE 12

Synthesis of Concrete Example [4-40]

After 10.00 g of brominated epoxy phenol novolak resin (manufactured by Nippon Kayaku Co., Ltd.; trade name: BREN-304; content of bromine atom: 42 mass %; substituted with c.a. 1.5 bromine atom per benzene ring) was dissolved in 32.20 g of propylene glycol monomethyl ether, 11.18 g of 2,4,6-tribromo-3-hydroxy benzoic acid and 1.05 g of benzyl triethylammonium chloride were mixed therewith. The resulting mixture was subjected to a reaction under nitrogen atmosphere at 130° C. for 24 hours to obtain a solution of polymer compound of concrete example [4-40] (wherein n=1.5). The resulting polymer compound was subjected to GPC analysis and had a weight average molecular weight of 3,800 in terms of standard polystyrene.

SYNTHESIS EXAMPLE 13

Synthesis of Concrete Example [4-41]

After 3.04 g of 2-(2,4,6-tribromophenoxy)ethylacrylate and 0.92 g of 2-hydroxypropylacrylate were dissolved in 10 g of propylene glycol monomethyl ether, the atmosphere was replaced with nitrogen. The resulting solution was warmed to 70° C., and then a solution of 0.040 g of azobisisobutyronitrile dissolved in 6 g of propylene glycol monomethyl ether was added dropwise. The resulting solution was subjected to a reaction under nitrogen atmosphere for 24 hours to obtain a solution of polymer compound of concrete example [4-41]. The resulting polymer compound was subjected to GPC analysis and had a weight average molecular weight of 12,000 in terms of standard polystyrene.

SYNTHESIS EXAMPLE 14

Synthesis of Concrete Example [4-42]

After 1.20 g of 2-(2,3,4,5-tetrabromo-6-methoxyphenoxy)ethylacrylate and 0.29 g of 2-hydroxypropylacrylate were dissolved in 5 g of cyclohexanone, the atmosphere was replaced with nitrogen. The resulting solution was warmed to 70° C., and then a solution of 0.015 g of azobisisobutyronitrile dissolved in 3.5 g of cyclohexanone was added dropwise. The resulting solution was subjected to a reaction under nitrogen atmosphere for 24 hours to obtain a solution of polymer compound of concrete example [4-42]. The resulting polymer compound was subjected to GPC analysis and had a weight average molecular weight of 7,400 in terms of standard polystyrene.

EXAMPLE 1

10 g of a solution containing 2 g of the polymer compound obtained in Synthesis Example 1 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 2

10 g of a solution containing 2 g of the polymer compound obtained in Synthesis Example 2 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 3

10 g of a solution containing 2 g of the polymer compound obtained in Synthesis Example 3 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 4

10 g of a solution containing 2 g of the polymer compound obtained in Synthesis Example 4 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 5

10 g of a solution containing 2 g of the polymer compound obtained in Synthesis Example 5 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 6

10 g of a solution containing 2 g of the polymer compound obtained in Synthesis Example 6 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 7

10 g of a solution of propylene glycol monomethyl ether containing 2 g of a commercially available bromide of polyparavinylphenol (Maruzen Petrochemical Co., Ltd.; trade name: Maruka Lyncur MB) was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 8

10 g of a solution containing 2 g of the polymer compound obtained in Synthesis Example 7 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 9

10 g of a solution containing 2 g of the polymer compound obtained in Synthesis Example 8 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 10

10 g of a solution containing 2 g of the polymer compound obtained in Synthesis Example 9 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 11

10 g of a solution containing 2 g of the polymer compound obtained in Synthesis Example 11 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 12

10 g of a solution containing 2 g of the polymer compound obtained in Synthesis Example 12 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 13

10 g of a solution containing 2 g of the polymer compound obtained in Synthesis Example 13 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 14

10 g of a solution containing 2 g of the polymer compound obtained in Synthesis Example 14 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 15

10 g of a solution containing 2 g of the polymer compound obtained in Synthesis Example 12 was mixed with 6.0 g of tetrabutoxymethyl glycoluril (product name: Cymel 1170; manufactured by Mitsui Cytec Co., Ltd.) as a crosslinking agent and 0.6 g of pyridinium p-toluenesulfonic acid as a catalyst, and dissolved in 103.7 g of propylene glycol monomethyl ether and 47.0 g of propylene glycol monomethyl ether acetate as solvents to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

COMPARATIVE EXAMPLE 1

10 g of a solution containing 2 g of the polymer compound obtained in Synthesis Example 10 was mixed with 0.5 g of tetramethoxymethyl glycoluril as a crosslinking agent and 0.05 g of p-toluenesulfonic acid as a catalyst, and dissolved in 56.7 g of propylene glycol monomethyl ether as a solvent to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

Dissolution Test in Solvent for Photoresist

The composition solutions for forming anti-reflective coating obtained in Examples 1 to 15 and Comparative Example 1 were coated on silicon wafers by means of a spinner. The coated silicon wafers were heated at 205° C. for 1 minute on a hot plate to form anti-reflective coatings (film thickness 0.10 μm). The anti-reflective coatings were dipped in a solvent used for resists, that is ethyl lactate and propylene glycol monomethyl ether and as a result it was confirmed that the resulting coatings were insoluble in these solvents.

Test of Intermixing with Photoresist

The composition solutions for forming anti-reflective coating obtained in Examples 1 to 15 and Comparative Example 1 were coated on silicon wafers by means of a spinner. The coated silicon wafers were heated at 205° C. for 1 minute on a hot plate to form anti-reflective coatings (film thickness 0.10 μm). On each anti-reflective coating was coated a commercially available photoresist solution (manufactured by Shipley Company; trade name: APEX-E) by means of a spinner. The coated wafers were heated at 90° C. for 1 minute on a hot plate. After exposure of the resists to light, post exposure bake (PEB) was performed at 90° C. for 1.5 minute. After developing the photoresists, the film thickness of the anti-reflective coatings was measured and no change was confirmed in the film thickness. Thus it was confirmed that no intermixing occurred between the anti-reflective coatings obtained from anti-reflective coating solutions prepared in Examples 1 to 15 and Comparative Example 1 and the photoresist layers.

Test on Optical Parameter

The composition solutions for forming anti-reflective coating obtained in Examples 1 to 15 and Comparative Example 1 were coated on silicon wafers by means of a spinner. The coated silicon wafers were heated at 205° C. for 1 minute on a hot plate to form anti-reflective coatings (film thickness 0.06 μm). On each anti-reflective coating, refractive index (n) and attenuation coefficient (k) at a wavelength of 157 nm were measured with a spectroscopic ellipsometer (manufactured by J. A. Woollam Co., VUV-VASE VU-302). The results of the measurement are shown in Table 1. In addition, Table 2 shows the content (mass %) of halogen atom in the solid content in the composition of Examples together with attenuation coefficient (k).

TABLE 1

|  | Refractive index (n) | Attenuation coefficient (k) |
|---|---|---|
| Example 1 | 1.79 | 0.31 |
| Example 2 | 1.79 | 0.40 |
| Example 3 | 1.78 | 0.48 |
| Example 4 | 1.68 | 0.30 |
| Example 5 | 1.73 | 0.36 |
| Example 6 | 1.64 | 0.29 |
| Example 7 | 1.80 | 0.39 |
| Example 8 | 1.82 | 0.25 |
| Example 9 | 1.72 | 0.25 |
| Example 10 | 1.69 | 0.32 |
| Example 11 | 1.70 | 0.46 |
| Example 12 | 1.74 | 0.39 |
| Example 13 | 1.81 | 0.30 |
| Example 14 | 1.78 | 0.32 |
| Example 15 | 1.65 | 0.36 |
| Comparative Example 1 | 1.75 | 0.19 |

TABLE 2

|  | Content of halogen atom (mass %) | Attenuation coefficient (k) |
|---|---|---|
| Example 1 | 27 | 0.31 |
| Example 2 | 38 | 0.40 |
| Example 3 | 49 | 0.48 |
| Example 8 | 27 | 0.25 |
| Example 9 | 19 | 0.25 |
| Example 10 | 25 | 0.32 |

From these results, it is understood that the anti-reflective coating material of the present invention has a satisfactorily high attenuation coefficient k for a light of a wavelength of 157 nm, and can control the k value in a range of 0.2 to 0.48 by changing the kind or content of halogen atom, thereby providing excellent bottom type organic anti-reflective coatings. In addition, Examples 1 to 3, 9 and 10 in Table 2 shows that in case where the anti-reflective coatings contain the same kind of halogen atom, attenuation coefficient k increases with the increase of its content. Further, from the comparison of the content of halogen atom and the attenuation coefficient k in Examples 1, 2 and 8, it is understood that bromine atom has a larger effect on the k value than chlorine atom, that is, bromine atom can afford a large attenuation coefficient k in a lower content compared with chlorine atom. From the comparison of Examples 1 and 10, it is understood that bromine atom has an effect on the k value comparable with iodine atom.

INDUSTRIAL APPLICABILITY

The present invention provides a composition for forming anti-reflective coating having a strong absorption of light at a wavelength of 157 nm. The anti-reflective coating obtained from the composition efficiently absorbs reflection light from a substrate.

The present invention provides a composition for forming anti-reflective coating for lithography which effectively absorbs reflection light from a substrate when irradiation light from F2 excimer laser (wavelength 157 nm) is used for micro-processing, and which causes no intermixing with photoresist layer Further, the present invention provides a method of controlling attenuation coefficient k of anti-reflective coating.

The control of attenuation coefficient k is carried out by changing the content of halogen atom in the solid content of the composition for forming anti-reflective coating. The control method enables modification in characteristics of anti-reflective coatings so as to suit the kind or required characteristics of photoresists.

The invention claimed is:

1. A composition for forming anti-reflective coating, comprising: a solid content and a solvent, and a proportion of at least one halogen atom selected from the group consisting of bromine atom and iodine atom in the solid content is 10 mass % to 60 mass %, and the solid content contains a polymer compound selected from the group consisting of a bisphenol A derivative resin, a phenol novolak derivative resin, and a polyparavinylphenol derivative resin, the polymer compound having a repeating structural unit containing the at least one halogen atom.

2. The composition for forming anti-reflective coating according to claim 1, wherein the repeating structural unit further contains a crosslink-forming substituent.

3. The composition for forming anti-reflective coating according to claim 1, wherein the polymer compound further has a repeating structural unit containing a crosslink-forming substituent.

4. The composition for forming anti-reflective coating according to claim 1, wherein the polymer compound contains at least 20 mass % of the at least one halogen atom selected from the group consisting of bromine atom and iodine atom.

5. The composition for forming anti-reflective coating according to claim 1, wherein the polymer compound has a weight average molecular weight of 700 to 1,000,000.

6. A composition for forming anti-reflective coating characterized in that the composition comprises a solid content and a solvent, and a proportion of at least one halogen atom selected from the group consisting of bromine atom and iodine atom in the solid content is 10 mass % to 60 mass %, wherein the solid content contains a polymer compound having a repeating structural unit comprising the at least one halogen atom and a crosslink-forming substituent, wherein the repeating structural unit is represented by formula (1)

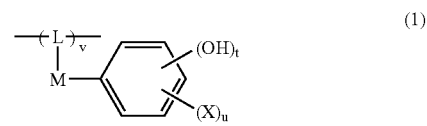

wherein L is a bonding group constituting a main chain of the polymer compound, M is a linking group containing at least one linking group selected from —C(=O)—, —CH$_2$— or —O—, or a direct bond, X is bromine atom or iodine atom, t is a number of 1 or 2, u is a number of 2, 3 or 4, v is a number of the repeating structural units contained in the polymer compound and is a number of 1 to 3,000.

7. The composition for forming anti-reflective coating according to claim 1, wherein the solid content further contains a crosslinking agent having at least two crosslink-forming substituents.

8. An anti-reflective coating produced by coating the composition for forming anti-reflective coating according to claim 1, on a semiconductor substrate, and baking it, wherein the anti-reflective coating has an attenuation coefficient k to a light at a wavelength of 157 nm ranging from 0.20 to 0.50.

9. A method of forming an anti-reflective coating for use in a manufacture of a semiconductor device, comprising the steps of: coating the composition for forming anti-reflective coating according to claim 1, on a substrate, and baking it.

10. A method of forming an anti-reflective coating for use in a manufacture of a semiconductor device by use of a light of wavelength 157 nm, comprising the steps of: coating the composition for forming anti-reflective coating according to claim 1, on a substrate, and baking it.

11. A method of forming a photoresist pattern for use in a manufacture of a semiconductor device comprising the steps of:
coating the composition for forming anti-reflective coating according to claim 1, on a semiconductor substrate and baking it to form an anti-reflective coating;
forming a photoresist layer on the anti-reflective coating;
exposing the semiconductor substrate covered with the anti-reflective coating and the photoresist layer with F2 excimer laser (wavelength 157 nm); and
developing the exposed photoresist layer.

* * * * *